(12) United States Patent
Tsukada

(10) Patent No.: US 8,044,765 B2
(45) Date of Patent: Oct. 25, 2011

(54) CHIP RESISTOR AND METHOD OF MAKING THE SAME

(75) Inventor: Torayuki Tsukada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 419 days.

(21) Appl. No.: 12/328,529

(22) Filed: Dec. 4, 2008

(65) Prior Publication Data

US 2009/0153287 A1 Jun. 18, 2009

(30) Foreign Application Priority Data

Dec. 17, 2007 (JP) ................................ 2007-324613
Feb. 14, 2008 (JP) ................................ 2008-033114
Aug. 26, 2008 (JP) ................................ 2008-216538

(51) Int. Cl.
*H01C 1/142* (2006.01)
(52) U.S. Cl. ........................ 338/327; 338/307; 29/610.1
(58) Field of Classification Search .......... 338/307–309, 338/327; 29/610, 610.1
See application file for complete search history.

(56) References Cited

U.S. PATENT DOCUMENTS

| | | | | |
|---|---|---|---|---|
| 5,604,477 A | * | 2/1997 | Rainer et al. | 338/293 |
| 6,081,181 A | * | 6/2000 | Kawase et al. | 338/22 R |
| 6,801,118 B1 | * | 10/2004 | Ikemoto et al. | 338/307 |
| 7,129,814 B2 | * | 10/2006 | Tsukada | 338/309 |
| 2007/0001802 A1 | * | 1/2007 | Hsieh | 338/309 |

FOREIGN PATENT DOCUMENTS

JP 2002-57009 2/2002

\* cited by examiner

*Primary Examiner* — Kyung Lee
(74) *Attorney, Agent, or Firm* — Hamre, Schumann, Mueller & Larson, P.C.

(57) ABSTRACT

A chip resistor includes a metal resistor element made in the form of a chip that includes an upper surface, a lower surface, two end surfaces, and two side surfaces. Two electrodes are formed on the resistor element to be spaced from each other in a longitudinal direction of the resistor element. Each of the electrodes is formed directly on the resistor element and extends continuously from the lower surface onto the upper surface via a corresponding one of the two end surfaces.

9 Claims, 11 Drawing Sheets

CHIP RESISTOR AND METHOD OF MAKING THE SAME

BACKGROUND OF THE INVENTION

1. Field of the Invention

The present invention relates to a chip resistor and a method of making a chip resistor.

2. Description of the Related Art

FIG. 16 shows a conventional method of making a chip resistor (see JP-A-2002-57009). In this method, first, as shown in (a) in the figure, two metal plates 90' and 91' are prepared. Then, as shown in (b), the metal plate 91' is bonded to the lower surface of the metal plate 90'. Then, as shown in (c), part of the metal plate 91' is cut away by machining to form a gap 93. Then, as shown in (d), a solder layer 92' is formed on the lower surface of the metal plate 91'. Then, the metal plates 90' and 91' are cut as shown in (e), whereby a chip resistor B is obtained. The chip resistor B manufactured in this way includes a pair of electrodes 91 on the lower surface of the resistor element 90 which are spaced from each other via the gap 93. To enhance the solderability in the mounting process, a solder layer 92 is formed on the lower surface of each of the electrodes 91.

Generally, in incorporating a chip resistor in a circuit to make a product, it is preferable that part of solder adheres to an end surface of the resistor element of the chip resistor to form a solder fillet. The bonding portion at which a solder fillet is formed has a high bonding strength, and the electrical conduction at the bonding portion is reliable. Thus, the bonding condition can be easily determined by checking the presence or absence of a solder fillet from the outside. That is, when the presence of a solder fillet is observed from the outside, it can be determined that the chip resistor is properly mounted. Conversely, when the presence of a solder fillet is not observed from the outside, it can be determined that the chip resistor is not properly mounted.

In the above-described chip resistor B, e.g. Ni—Cu-based alloy, Cu—Mn-based alloy or Ni—Cr-based alloy is used as the material of the resistor element 90. However, these alloys do not have a sufficient solder wettability, so that it is difficult to form a proper solder fillet directly on the two end surfaces of the resistor element 90. Although the solder layer 92 is provided on the lower surface of each electrode 91, the provision of the solder layer 92 is not sufficient for forming a solder fillet. When the chip resistor B is to be surface-mounted on an object by reflow soldering, cream solder is applied in advance to a portion of the object to which the chip resistor B is to be mounted. However, when the amount of the cream solder is insufficient, a proper solder fillet is not formed. In this way, a solder fillet is not reliably formed in the conventional method.

Further, the conventional method of making the chip resistor B requires the steps of bonding the metal plates 90' and 91' together and machining the metal plate 91'. These are troublesome work which takes relatively a long time, so that the making efficiency of the chip resistor B is deteriorated.

SUMMARY OF THE INVENTION

An object of the present invention, which is proposed under the circumstances described above, is to provide a chip resistor which ensures proper formation of a solder fillet in surface-mounting. Another object of the present invention is to provide a method for properly and efficiently making such a chip resistor.

According to a first aspect of the present invention, there is provided a chip resistor comprising a chip resistor element provided with a first electrode and a second electrode. The chip resistor element is made of a metal and has first through sixth surfaces. The first surface and the second surface are spaced from each other in a first direction. Likewise, the third surface and the fourth surface are spaced from each other in a second direction perpendicular to the first direction, and the fifth surface and the sixth surface are spaced from each other in a third direction perpendicular to both the first direction and the second direction. The first and the second electrodes, formed on the resistor element, are spaced from each other in the second direction. The first electrode is formed directly on the resistor element so as to extend continuously on the first surface, the third surface and the second surface. The second electrode is formed directly on the resistor element so as to extend continuously on the first surface, the fourth surface and the second surface.

Preferably, the first surface and the second surface may be formed with an insulating film covering a region between the first electrode and the second electrode.

Preferably, the first electrode and the second electrode may be made of Cu.

Preferably, the chip resistor may have a greater size in the third direction than in the second direction, or in the second direction than in the third direction.

According to a second aspect of the present invention, there is provided a method of making a chip resistor. According to the method, an elongated resistor element bar is prepared, which has a rectangular cross section and includes a first surface and a second surface that are spaced from each other in a thickness direction of the bar. Then, an elongated first insulating film and an elongated second insulating film are formed on the first surface and the second surface, respectively, in a manner such that the first insulating film leaves uncovered two marginal regions of the first surface that are spaced from each other in a width direction of the first surface, and that the second insulating film leaves uncovered two marginal regions of the second surface that are spaced from each other in a width direction of the second surface. Then, a conductor layer is formed by plating on exposed portions of the resistor element bar that are not covered by the first and the second insulating films. Finally, the resistor element bar is divided by cutting at intervals in the longitudinal direction of the bar.

In a preferred embodiment, the resistor element bar may be transferred in the longitudinal direction of the bar along a prearranged operation line provided with an insulating film forming section for forming the first and the second insulating films and with a conductor layer forming section for forming the conductor layer. The dividing of the resistor element bar is performed after the bar has passed through the insulating film forming section and the conductor layer forming section.

According to a third aspect of the present invention, there is provided another method of making a chip resistor. According to the method, a resistor element frame is prepared, which includes a plurality of elongated resistor element bars and a connecting portion for connecting ends of the respective resistor element bars, where the resistor element bars are parallel to and spaced from each other, and each of the resistor element bars has a first surface and a second surface that are spaced from each other in a thickness direction of the bar. Then, insulating film formation, conductor layer formation and longitudinal division are performed collectively with respect to the resistor element bars. Specifically, in the insulating film formation, an elongated first insulating film is formed on the first surface of each resistor element bar in a manner such that the first insulating film leaves uncovered two marginal regions of the first surface spaced from each other in a width direction of the first surface. Likewise, an elongated second insulating film is formed on the second surface of each resistor element bar in a manner such that the second insulating film leaves uncovered two marginal regions of the second surface spaced from each other in a width direction of the second surface. Then, in the conductor layer formation, a conductor layer is formed by plating on exposed portions of each resistor element bar that are not covered by the first and the second insulating films. Finally, in the longitudinal division, each resistor element bar is divided by cutting at intervals in the longitudinal direction of the resistor element bar.

Other features and advantages of the present invention will become more apparent from detailed description given below with reference to the accompanying drawings.

DETAILED DESCRIPTION OF THE PREFERRED EMBODIMENTS

Preferred embodiments of the present invention will be described below with reference to the accompanying drawings.

Figure 1:
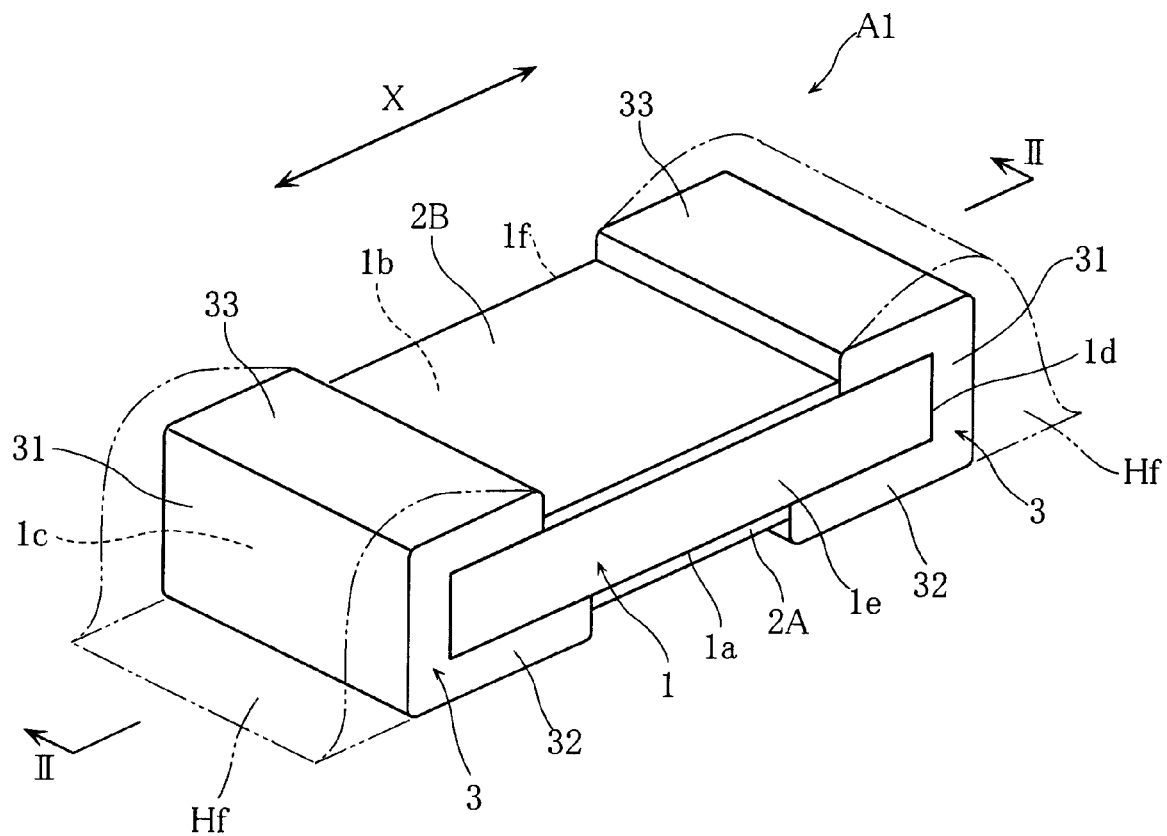
FIG. 1 is a perspective view showing a first embodiment of a chip resistor according to the present invention.
Figure 2:
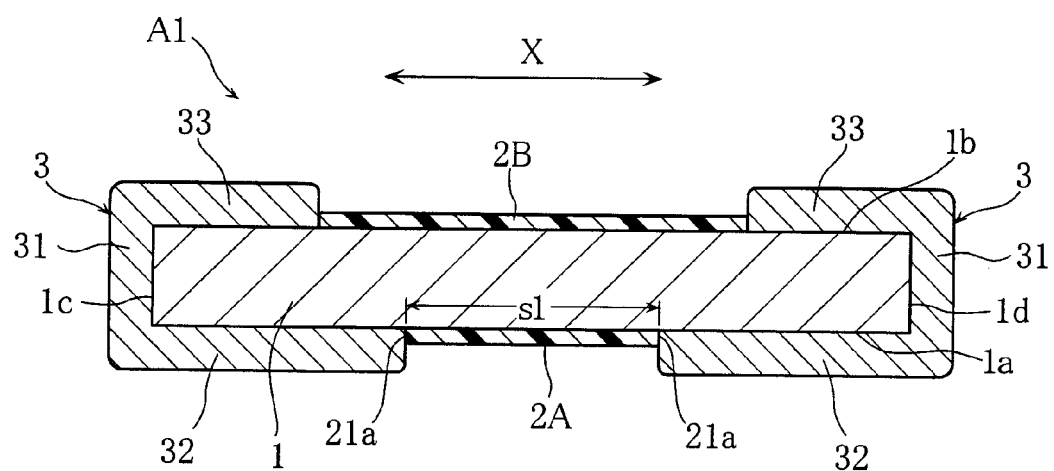
FIG. 2 is a sectional view taken along lines II-II in FIG. 1.

FIGS. 1 and 2 show a chip resistor according to a first embodiment of the present invention. The chip resistor A1 of this embodiment includes a resistor element 1, insulating films 2A, 2B and a pair of electrodes 3.

The resistor element 1 is made of a metal and in the form of a chip which is rectangular as viewed in plan and has a constant thickness. As the material of the resistor element 1, use may be made of Fe—Cr-based alloy, Ni—Cr-based alloy or Ni—Cu-based alloy. However, the material of the resistor element 1 is not limited to these, and a metal material having a specific resistance suitable for the size, and intended resistance of the resistor element 1 is selected appropriately.

Both of the insulating films 2A and 2B are coating films made of a resin such as epoxy resin. The insulating film 2A covers the lower surface 1a of the resistor element 1 between the paired electrodes 3. The insulating film 2B covers the upper surface 1b of the resistor element 1 between the paired electrodes 3.

The paired electrodes 3 are spaced from each other in the x direction. The electrodes 3 are made of a metal having a higher solder wettability than that of the resistor element 1. For instance, the electrodes 3 are made of Cu. Each of the electrodes 3 comprises an end electrode portion 31 covering an end surface 1c or 1d in the X direction of the resistor element 1, a lower electrode portion 32 covering part of the lower surface 1a connected to the end surface 1c or 1d, and an upper electrode portion 33 covering part of the upper surface 1b connected to the end surface 1c or 1d. These electrode portions 31, 32 and 33 are connected to each other to be generally U-shaped.

As better shown in FIG. 2, the respective inner end surfaces of the lower electrode portions 32 are connected to two end surfaces 21a of the insulating film 2A. That is, the distance between the lower electrode portions 32 is defined by the end surfaces 21a of the insulating film 2A and equals to the width s1 of the insulating film 2A. The dimension of the lower electrode portion 32 in the X direction is larger than the dimension of the upper electrode portion 33 in the X direction.

For instance, the thickness of the resistor element 1 may be about 100-500 μm, the thickness of the insulating films 2A, 2B may be about 20 μm and the thickness of the electrodes 3 may be about 30 to 200 μm. Each of the length and width of the resistor element 1 may be about 2 to 7 mm. However, the size of the resistor element 1 is varied depending on the intended resistance and may be different from the above. The chip resistor A1 is designed as a low resistance resistor, and the resistance between the paired electrodes 3 (between the lower electrode portions 32 on the mounting side) is about 1 to 10 mΩ.

Figure 3:
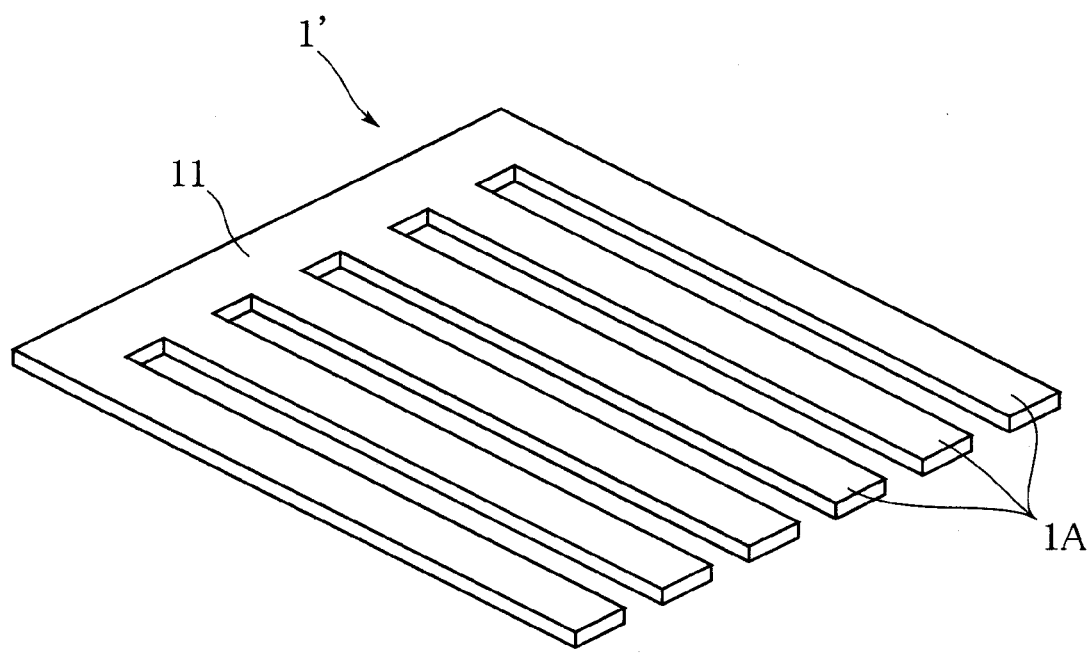
FIG. 3 is a perspective view showing an example of resistor element frame used for a first embodiment of a method of making a chip resistor according to the present invention.

FIGS. 3-6 show a method of making a chip resistor according to a first embodiment of the present invention. First, in this method, a resistor element frame 1' as shown in FIG. 3 is prepared. The resistor element frame 1' may be made of e.g. Fe—Cr-based alloy, Ni—Cr-based alloy or Ni—Cu-based alloy and includes a plurality of resistor element bars 1A and a connecting portion 11. The resistor element bars 1A are in the form of strips having a rectangular cross section and arranged in parallel with each other. The connecting portion 11 connects respective one ends of the resistor element bars 1A to each other.

Figure 4:
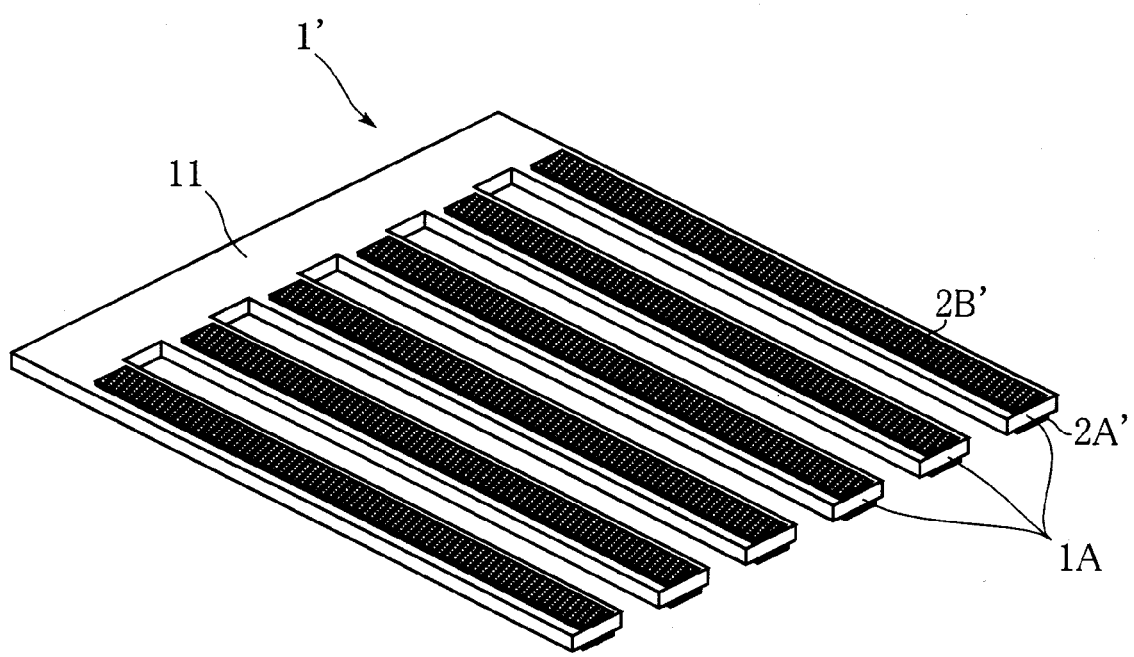
FIG. 4 is a perspective view showing the step of forming an insulating film in the first embodiment of a method of making a chip resistor according to the present invention.

Then, as shown in FIG. 4, insulating films 2B' and 2A' are formed on the upper surface and the lower surface of each resistor element bar 1A, respectively. Specifically, the insulating film 2A' is formed to have a constant width on the lower surface of the resistor element bar 1A except the two widthwise opposite ends of the lower surface. The insulating film 2B' is formed to have a constant width on the upper surface of the resistor element bar 1A except the two widthwise opposite ends of the upper surface. In this embodiment, the width of the insulating film 2B' is slightly larger than that of the insulating film 2A'. The insulating films 2A', 2B' are formed by thick film printing such as screen printing using e.g. epoxy resin. By the thick film printing, it is possible to form the insulating films 2A', 2B' having desired width and thickness. A process of making a mark on the surface of the insulating film 2B' may be performed as required.

Figure 5:
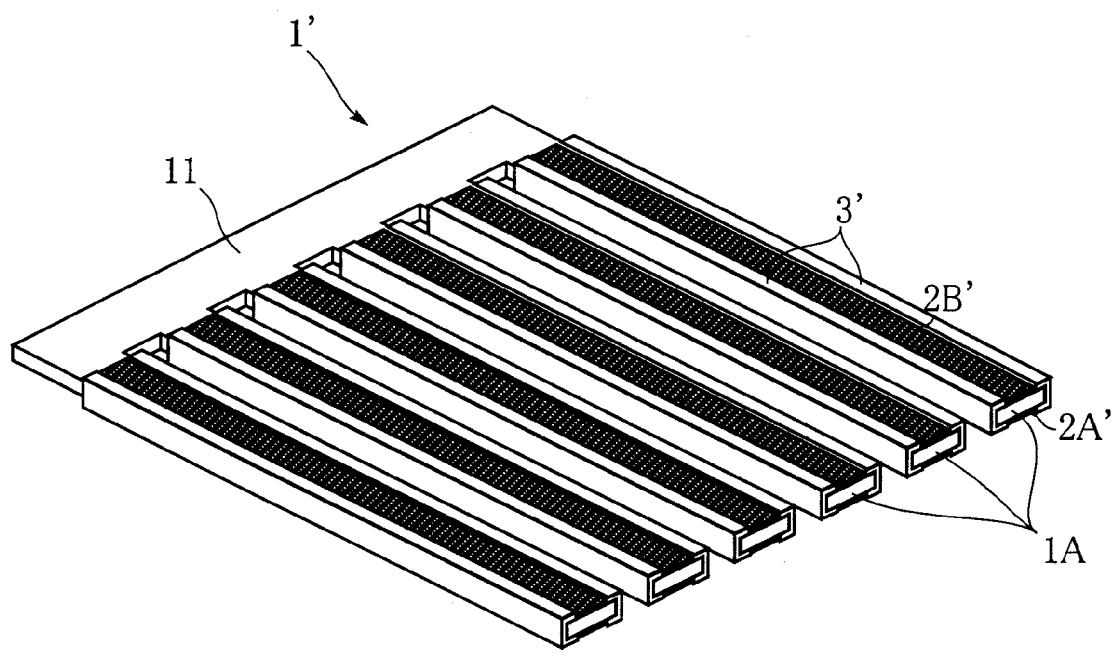
FIG. 5 is a perspective view showing the step of forming a conductor layer in the first embodiment of a method of making a chip resistor according to the present invention.

Then, as shown in FIG. 5, conductor layers 3' are formed on each of the resistor element bars 1A at portions which are not covered with the insulating films 2A' and 2B'. The conductor layers 3' may be formed by e.g. Cu plating. Although either of the electroplating and the electroless plating can be employed as the plating method, it is preferable to employ the electroplating. The electroplating is suitable for forming conductor layers 3' having a relatively large thickness. By the plating, conductor layers 3' are formed directly and simultaneously on all the exposed portions (portions which are not covered with the insulating films 2A' and 2B') of the resistor element bars 1A. Further, by the plating, it is possible to form the conductor layers 3' having precise dimensions without forming gaps between the conductor layers 3' and the insulating films 2A', 2B'. Moreover, by controlling the plating conditions, the conductor layers 3' having an intended thickness are formed reliably.

Figure 6:
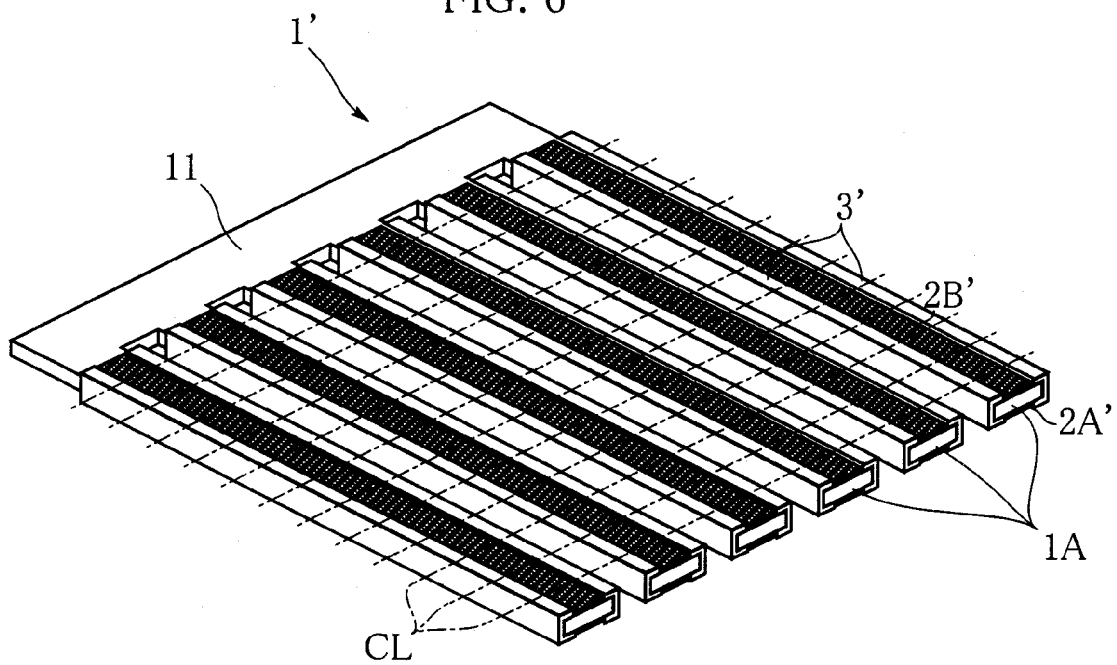
FIG. 6 is a perspective view showing the step of dividing the resistor element bar in the first embodiment of a method of making a chip resistor according to the present invention.

Then, as shown in FIG. 6, each of the resistor element bars 1A is divided. This division is performed by successively cutting each resistor element bar 1A along cutting lines CL extending perpendicularly to the longitudinal direction of the resistor element bar 1A. By this division step, a plurality of chip resistors A1 are obtained.

Figure 7:
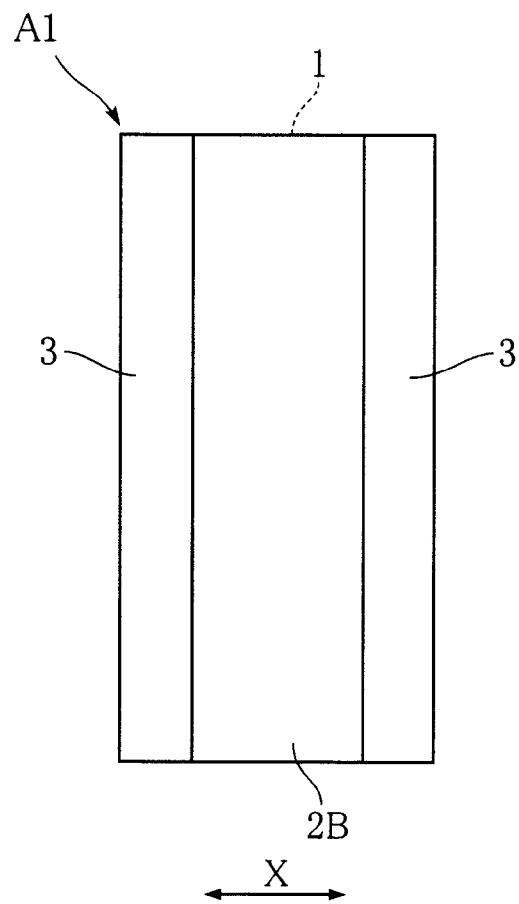
FIG. 7 is a plan view showing a variation of the first embodiment of the chip resistor according to the present invention.
Figure 8:
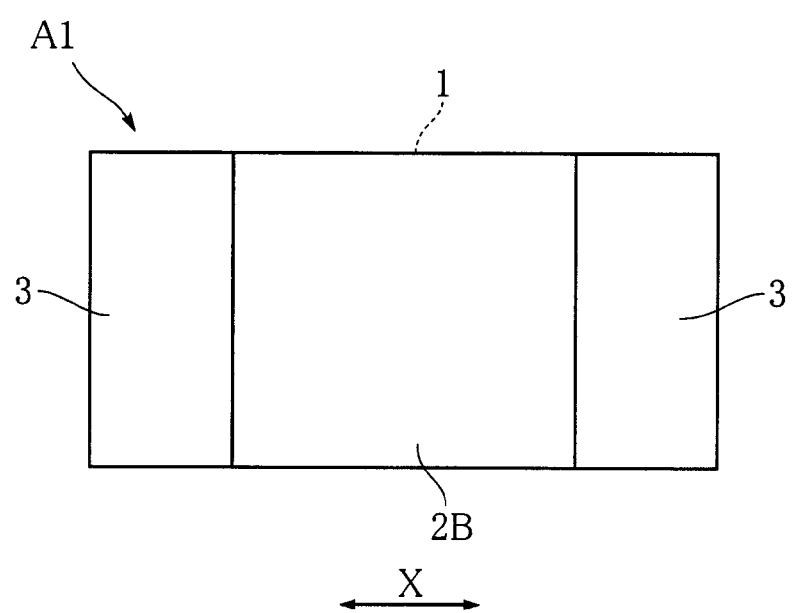
FIG. 8 is a plan view showing another variation of the first embodiment of the chip resistor according to the present invention.

By the chip resistor making method described above, chip resistors A1 having different length/width ratios can be obtained by changing the interval between the cutting lines CL shown in FIG. 6. For instance, when the interval between the cutting lines CL is set relatively large, the chip resistor A1 as shown in FIG. 7 is obtained. When the interval between the cutting lines CL is set relatively small, the chip resistor A1 as shown in FIG. 8 is obtained. In the chip resistor A1 shown in FIG. 8, the dimension in the direction which is perpendicular to the X direction is considerably smaller than the dimension in the X direction. The chip resistor A1 shown in FIG. 7 and that shown in FIG. 8 differ from each other in resistance. Specifically, the resistance of the chip resistor A1 shown in FIG. 7 is considerably lower than that shown in FIG. 8. By further changing the interval between the cutting lines CL, it is possible to obtain various chip resistors which differ from the chip resistors A1 shown in FIGS. 7 and 8 in length/width ratio.

The advantages of the chip resistor A1 and the method of making the chip resistor A1 according to this embodiment will be described below.

The chip resistor A1 of this embodiment is surface-mounted on a desired object by e.g. reflow soldering. In the reflow soldering, cream solder is applied to the terminals provided at a region of the object to which the chip resistor A1 is to be mounted. The chip resistor A1 is so placed that the lower electrode portions 32 of the electrodes 3 come into contact with this portion and heated in a reflow furnace.

Cu, which is the material of the electrodes 3, has a higher solder wettability than the alloy forming the resistor element 1. In this embodiment, the electrode 3 extends continuously over the lower surface 1a, the end surface 1c or 1d and the upper surface 1b of the resistor element 1. Thus, in surface-mounting the chip resistor A1, solder easily adheres also to the end electrode portion 31 and the upper electrode portion 33. As a result, a solder fillet Hf indicated by phantom lines in FIG. 1 is properly formed. Thus, whether or not the chip resistor A1 is properly mounted is easily determined based on the presence or absence of the solder fillet Hf. Further, the solder fillet Hf enhances the solder bonding strength of the chip resistor A1. Moreover, the heat generated during the operation of the chip resistor A1 is efficiently dissipated to the atmosphere or the circuit board via the solder fillet Hf. Thus, the temperature of the chip resistor A1 is prevented from excessively rising.

By employing the plating technique described before, the electrode 3 is easily formed to cover the wide area including the end surface 1c or 1d and the upper surface 1b as well as the lower surface 1a of the resistor element 1. Since the electrode 3 is formed on such a wide area, a sufficiently large solder fillet Hf is formed. The large solder fillet Hf is advantageous for enhancing the bonding strength and preventing the temperature rise of the chip resistor during the operation.

In the chip resistor A1 of this embodiment, the distance between the paired electrodes 3 is defined in forming the insulating film 2A as a pattern by thick film printing. Thus, the dimension accuracy is easily enhanced. As a result, in the chip resistor A1, the rated resistance close to the intended value is obtained.

The method of making the chip resistor A1 employs efficient techniques such as thick film printing and plating and does not involve complicated works such as bonding of different kinds of metals or machining. With this method, therefore, a plurality of chip resistors A1 are manufactured efficiently. The use of the resistor element frame 1' including a plurality of resistor element bars 1A is effective for efficiently making a large number of chip resistors A1. Further, by changing the distance between the cutting lines CL, the dimensions of the chip resistor A1 in the X direction and in the direction perpendicular to the X direction can be set appropriately. Thus, chip resistors A1 having different resistances can be obtained from a single resistor element frame 1'.

Moreover, by changing the distance between the cutting lines CL shown in FIG. 6, chip resistors A1 with different length/width ratios including those shown in FIGS. 7 and 8 can be manufactured. Thus, chip resistors A1 having different resistances can be efficiently manufactured without changing the making method.

FIGS. 9-15 show other embodiments of the present invention. In these figures, the elements which are identical or similar to those of the foregoing embodiment are designated by the same reference signs as those used for the foregoing embodiment.

Figure 9:
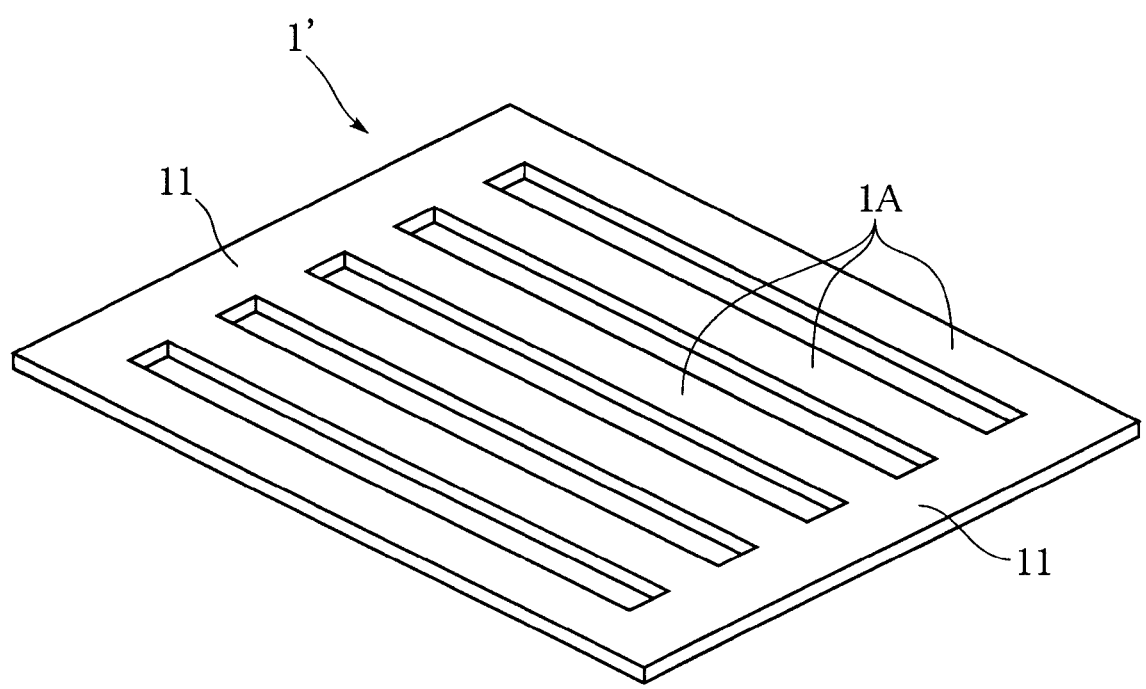
FIG. 9 is a perspective view showing another example of resistor element frame used for the first embodiment of a method of making a chip resistor according to the present invention.

FIG. 9 shows another example of resistor element frame 1' used in the method of making a chip resistor described with reference to FIGS. 3-6. Unlike the above-described resistor element frame 1', the resistor element frame 1' shown in FIG. 9 includes a pair of connecting portions 11. The resistor element bars 1A are arranged in parallel with each other and connected to each other at the respective two ends by the paired connecting portions 11. The chip resistors A1 are efficiently manufactured also when this resistor element frame 1' is used for the making method shown in FIGS. 3-6. The paired connecting portions 11 enhance the rigidity of the resistor element frame 1'.

Figure 10:
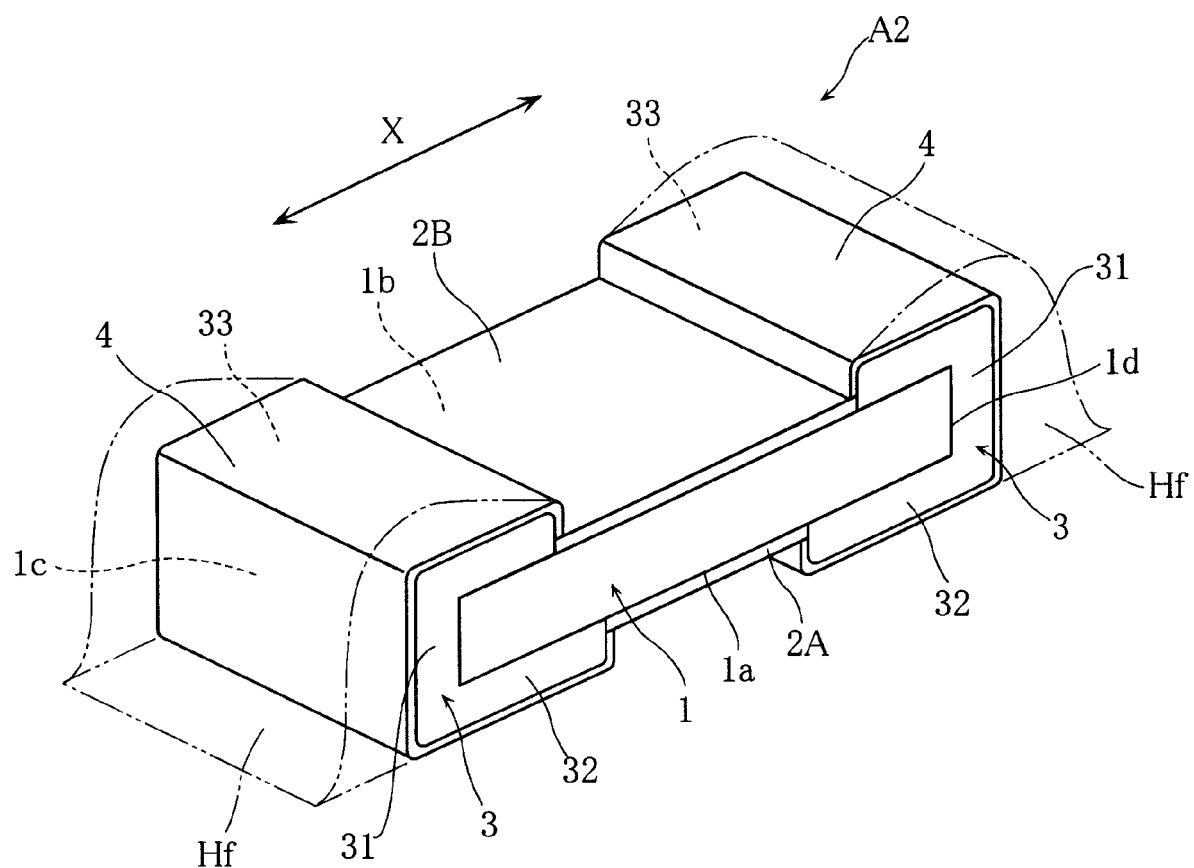
FIG. 10 is a perspective view showing a second embodiment of a chip resistor according to the present invention.

FIG. 10 shows a chip resistor according to a second embodiment of the present invention. The chip resistor A2 of this embodiment includes a pair of solder layers 4 in addition to the parts of chip resistor A1 of the first embodiment. Each of the solder layers 4 is generally U-shaped in side view and covers the surfaces of the corresponding electrode 3. For instance, the solder layer 4 is made of Sn. The solder layer 4 has a thickness of e.g. about 5 to 20 μm.

With this arrangement, all the surfaces on which a solder fillet Hf is to be formed are covered with the solder layer 4, which is advantageous for forming a solder fillet Hf. Cu, which is the material of the electrodes 3, has a higher solder wettability than the material of the resistor element 1. Thus, the solder layer 4 is formed more reliably as compared with the structure in which the solder layer 4 is formed directly on the resistor element 1.

Figure 11:
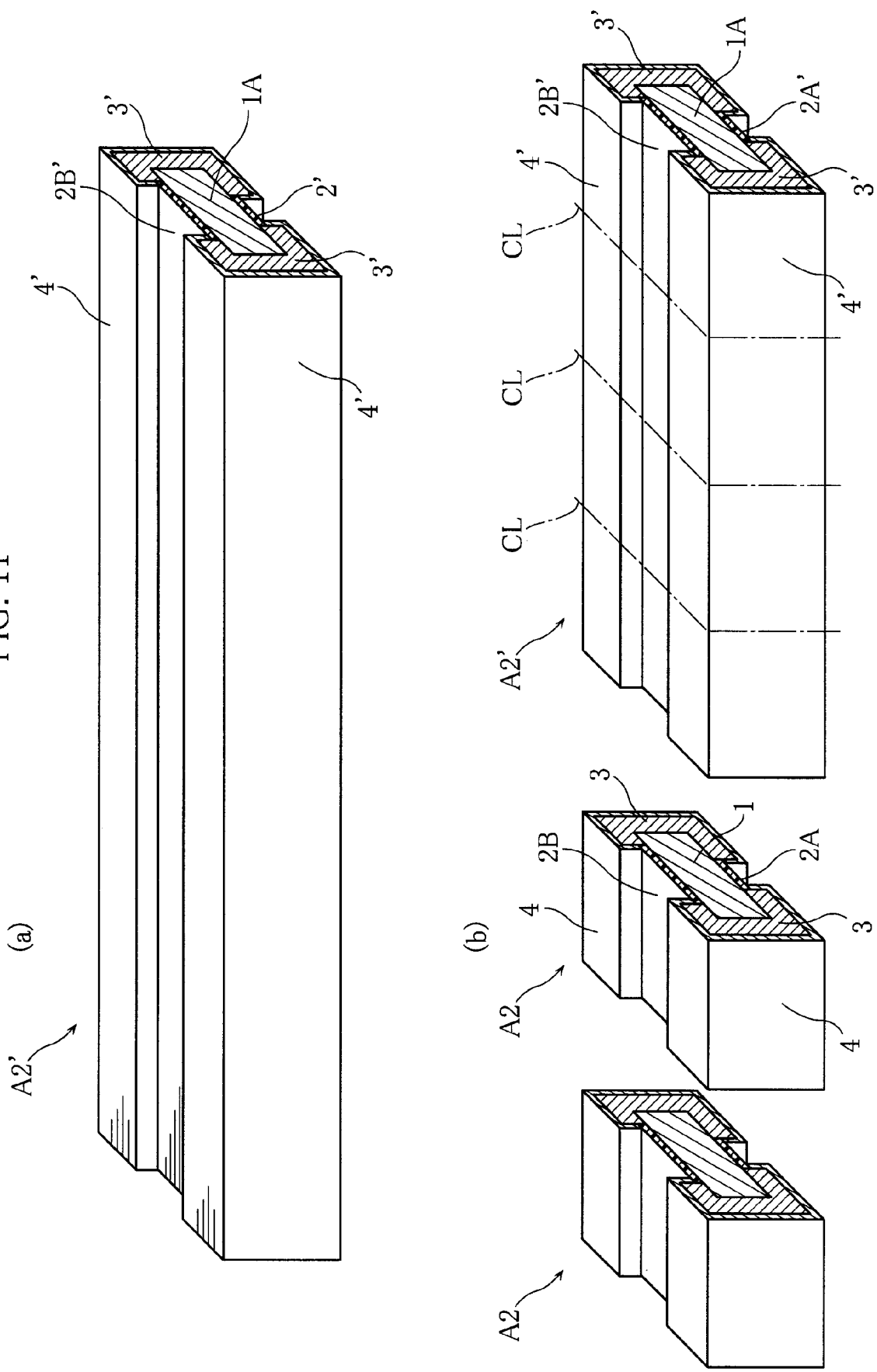
FIG. 11 is a perspective view showing a second embodiment of a method of making a chip resistor according to the present invention.

FIG. 11 shows a second embodiment of a method of making a chip resistor according to the present invention. Specifically, shown in this figure is a method of making the above-described chip resistor A2. In this method, first, as shown in FIG. 11(a), a resistor aggregate A2' in the form of a bar is prepared. To prepare the resistor aggregate A2', similarly to the making method of the first embodiment, insulating films 2A' and 2B' are formed on two surfaces of a resistor element bar 1A, and then conductor layers 3' are formed at exposed portions of the resistor element bar 1A. Then, solder layers 4' are formed on the conductor layers 3', whereby the resistor aggregate A2' is obtained. The solder layers 4' may be formed by plating. Then, as shown in FIG. 11(b), the resistor aggregate A2' is successively cut and divided along the cutting lines CL, whereby a plurality of chip resistors A2 are obtained. As seen from the figure, the cutting lines CL are provided at equal intervals in the longitudinal direction of the resistor element bar 1A, and each line CL, as viewed in plan, extends perpendicularly to the longitudinal direction of the bar 1A.

Figure 12:
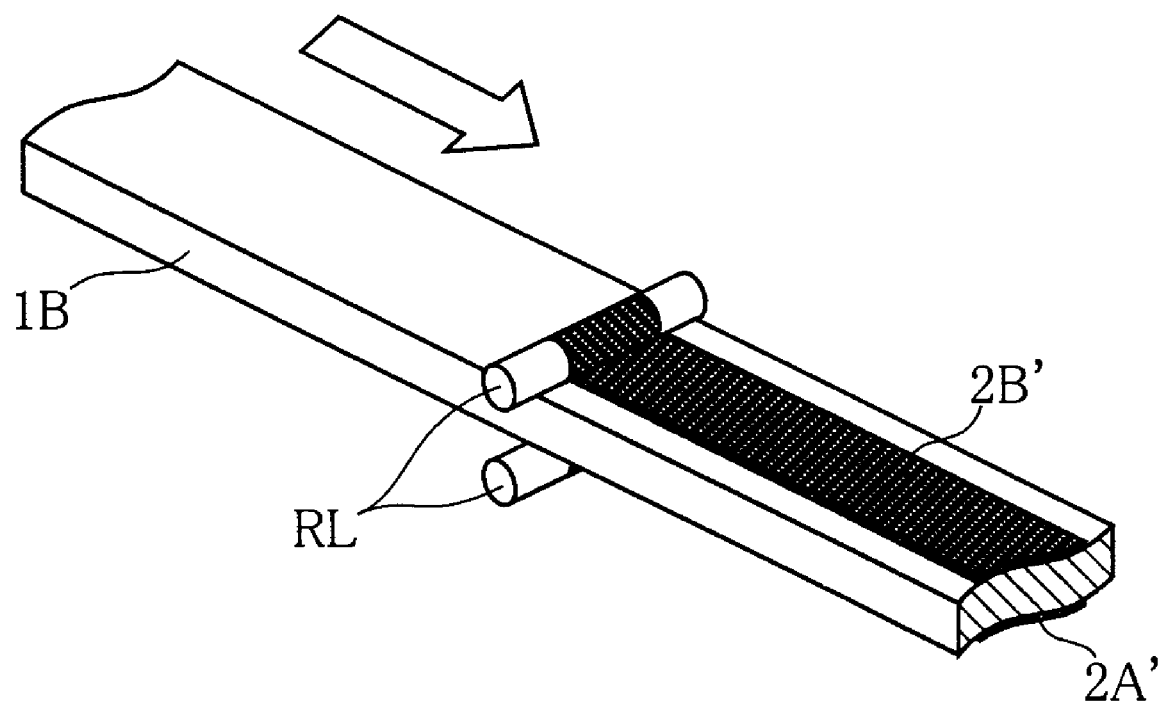
FIG. 12 is a perspective view showing the step of forming an insulating film in a third embodiment of a method of making a chip resistor according to the present invention.

FIGS. 12-15 show a third embodiment of a method of making a chip resistor according to the present invention. In this embodiment, as shown in FIG. 12, a resistor element hoop 1B is used as the material of the resistor element. The resistor element hoop 1B is in the form of a strip having a rectangular cross section. For instance, the hoop 1B before use is stored as wound around a reel (not shown). In the making process, the resistor element hoop 1B is drawn from the reel and transferred along a path defined by a plurality of rollers. An insulating film forming section, a conductor layer forming section and a division section are successively provided along this path.

FIG. 12 shows the step of forming insulating films 2A' and 2B' in the insulating film forming section. In the insulating film forming section, means for applying e.g. epoxy resin is provided. Preferably, as shown in the figure, the application means may comprise a pair of application rollers RL arranged to sandwich the resistor element hoop 1B. The application rollers RL are designed to continuously apply epoxy resin at a constant width. Thus, when the resistor element hoop 1B passes between the applications rollers RL, insulating films 2A' and 2B' in the form of a strip having a constant width are formed on the upper and the lower surfaces of the resistor element hoop 1B.

Figure 13:
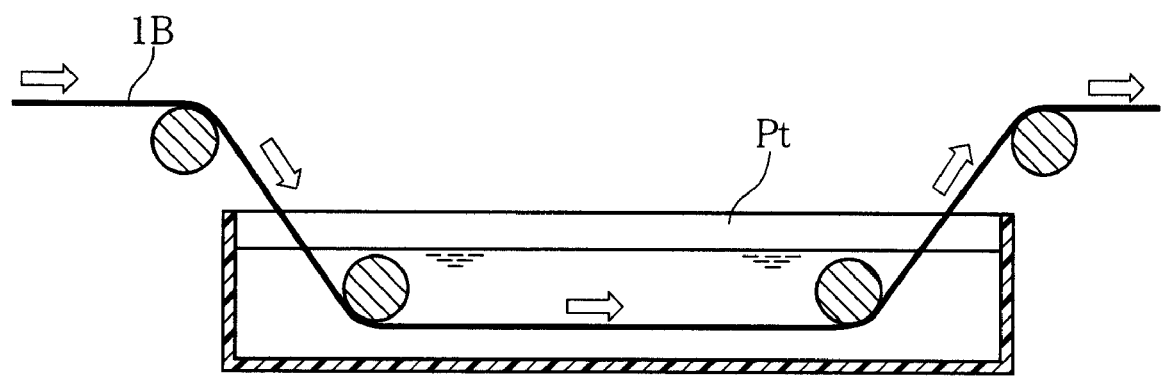
FIG. 13 is a sectional view showing a conductor layer forming section in the third embodiment of a method of making a chip resistor according to the present invention.
Figure 14:
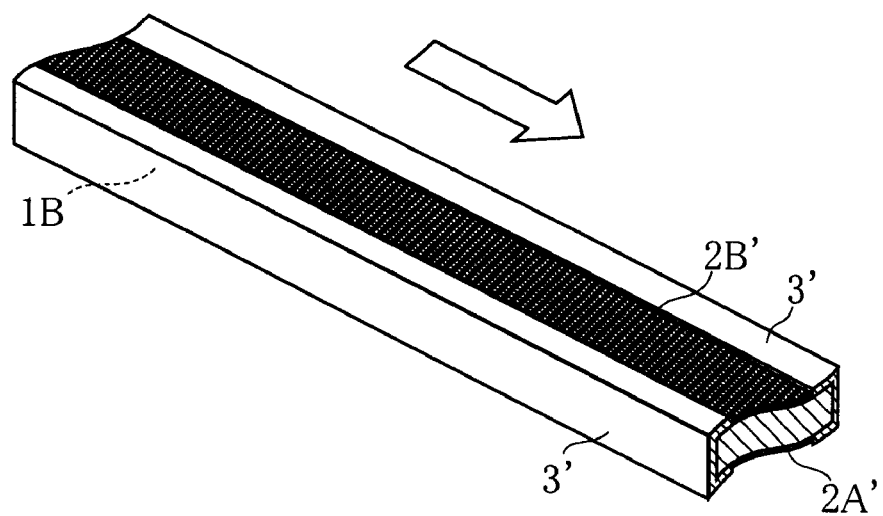
FIG. 14 is a perspective view showing a resistor element hoop on which a conductor layer is formed in the third embodiment of a method of making a chip resistor according to the present invention.

FIG. 13 shows an example of conductor layer forming section. The conductor layer forming section includes a plating bath Pt and a roller for transferring the resistor element hoop 1B toward the plating bath Pt. The plating bath Pt is a portion for performing electroplating of e.g. Cu and contains a plating liquid. FIG. 14 shows the resistor element hoop 1B after passing through the plating bath Pt. By the electroplating in the plating bath Pt, conductor layers 3' of Cu are formed at portions of the resistor element hoop 1B which are not covered with the insulating films 2A', 2B'. The conductor layers 3' may be formed by electroless plating instead of the electroplating.

Figure 15:
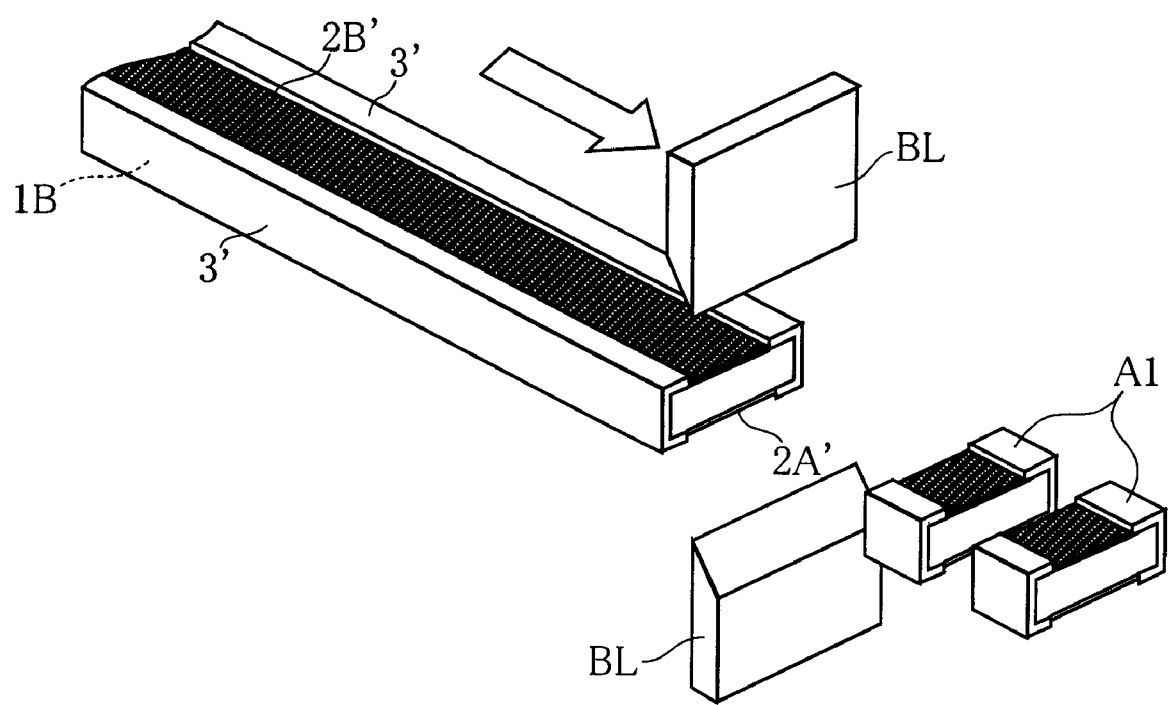
FIG. 15 is a perspective view showing the step of dividing the resistor element hoop in the third embodiment of a method of making a chip resistor according to the present invention.
Figure 16:
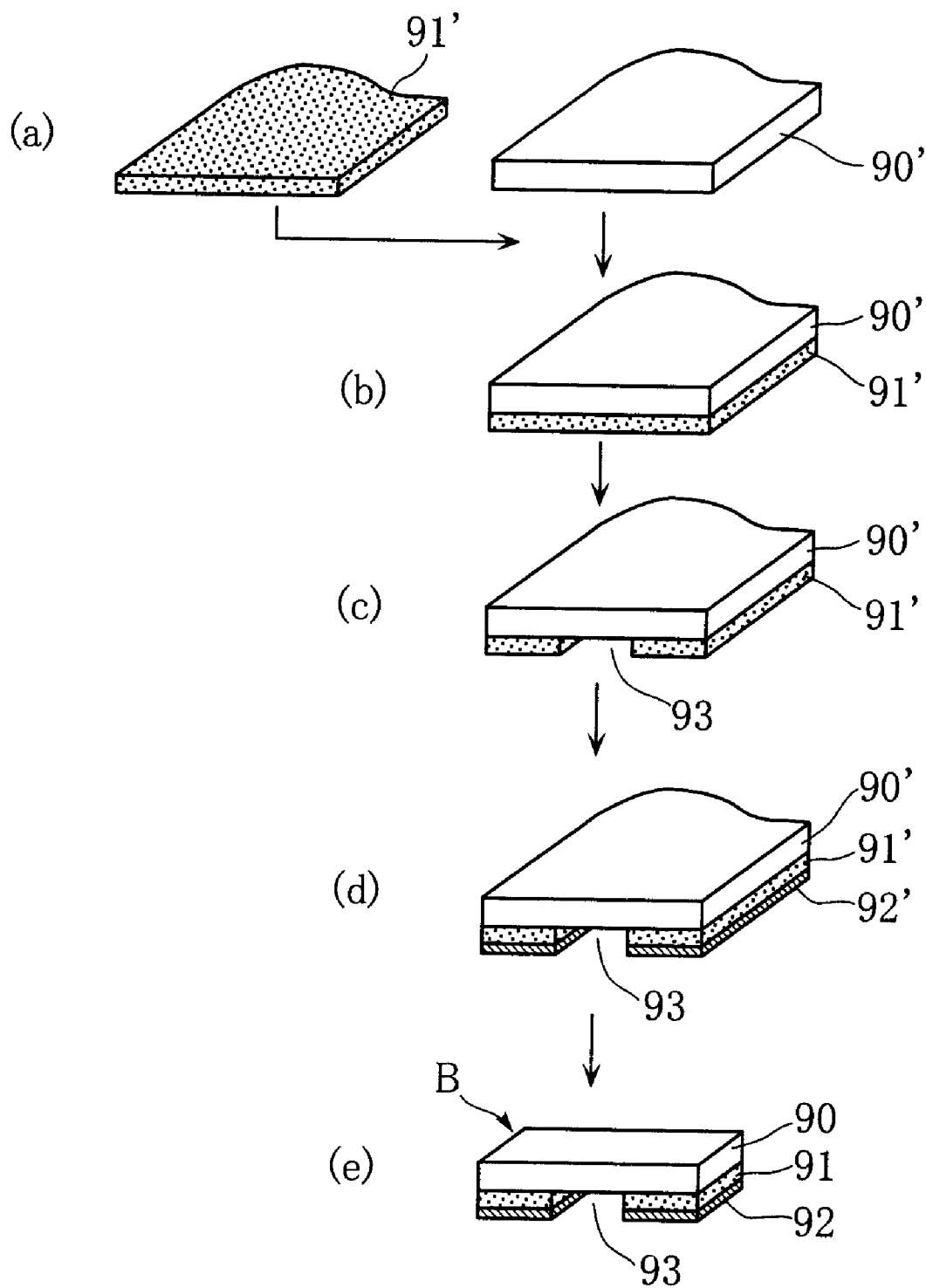
FIG. 16 is a perspective view showing an example of conventional method of making a chip resistor.

As shown in FIG. 15, after the plating step is performed, the resistor element hoop 1B is transferred to the division section. The division section of this embodiment includes a pair of cutting blades BL as cutting means. The cutting blades BL are designed to cut the resistor element hoop 1B in the process of being transferred at a constant speed at regular time intervals. As a result, the resistor element hoop 1B is divided into a plurality of chip resistors A1 of the same size. By this making method, the chip resistor A1 as shown in FIG. 1 is obtained. When a section for performing Sn plating is additionally provided downstream from the conductor layer forming section, the chip resistor A2 as shown in FIG. 10 is obtained.

According to this embodiment, chip resistor A1, A2 is manufactured not by batch production but by flow line production. This is advantageous for enhancing the making efficiency of the chip resistor A1, A2.

The method of making a chip resistor according to the present invention is not limited to the foregoing embodiments. The specific structure of the making method according to the present invention may be varied in design in many ways.

In the chip resistor A1, A2 described above, the side surfaces 1e and 1f of the resistor element 1 are exposed. Instead of this, however, insulating films may be further provided to cover the side surfaces 1e and 1f. When the side surfaces 1e and 1f are covered with insulating films, solder is prevented from unduly adhering to the resistor element 1 in surface-mounting the chip resistor A1, A2.

The invention claimed is:

1. A chip resistor comprising:
   a chip resistor element made of a metal and including first through sixth surfaces, the first surface and the second surface being spaced from each other in a first direction, the third surface and the fourth surface being spaced from each other in a second direction perpendicular to the first direction, the fifth surface and the sixth surface being spaced from each other in a third direction perpendicular to both the first direction and the second direction;
   a first electrode and a second electrode formed on the resistor element and spaced from each other in the second direction;
   a first insulating film formed on the first surface to cover only a region of the first surface between the first electrode and the second electrode; and
   a second insulating film formed on the second surface to cover only a region of the second surface between the first electrode and the second electrode;
   wherein the first electrode is formed directly on the resistor element and extends continuously on the first surface, the third surface and the second surface,
   wherein the second electrode is formed directly on the resistor element and extends continuously on the first surface, the fourth surface and the second surface.

2. The chip resistor according to claim 1, wherein the first electrode and the second electrode are made of a plated metal.

3. The chip resistor according to claim 1, wherein the first electrode and the second electrode are made of Cu.

4. The chip resistor according to claim 1, wherein the chip resistor has a greater size in the third direction than in the second direction.

5. The chip resistor according claim 1, wherein the chip resistor has a greater size in the second direction than in the third direction.

6. A method of making a chip resistor, the method comprising:
- preparing an elongated resistor element bar having a rectangular cross section and including a first surface and a second surface that are spaced from each other in a thickness direction of the bar;
- forming an elongated first insulating film and an elongated second insulating film on the first surface and the second surface, respectively, the first insulating film leaving uncovered two marginal regions of the first surface that are spaced from each other in a width direction of the first surface, the second insulating film leaving uncovered two marginal regions of the second surface that are spaced from each other in a width direction of the second surface;
- after forming the first and second insulating films, forming a conductor layer by plating on exposed portions of the resistor element bar that are not covered by the first and the second insulating films; and
- dividing the resistor element bar by cutting the bar at intervals in a longitudinal direction of the bar.

7. The method according to claim 6, wherein the resistor element bar is transferred in the longitudinal direction of the bar along an operation line provided with an insulating film forming section for forming the first and the second insulating films and with a conductor layer forming section for forming the conductor layer, and wherein the dividing of the resistor element bar is performed after the bar has passed through the insulating film forming section and the conductor layer forming section.

8. A method of making a chip resistor, the method comprising:
- preparing a resistor element frame that includes a plurality of elongated resistor element bars and a connecting portion for connecting ends of the respective resistor element bars, the resistor element bars being parallel to and spaced from each other, each of the resistor element bars having a first surface and a second surface that are spaced from each other in a thickness direction of said each bar;
- performing insulating film formation collectively with respect to the resistor element bars;
- performing conductor layer formation collectively with respect to the resistor element bars after performing the insulating film formation;
- performing longitudinal division collectively with respect to the resistor element bars;
- wherein in the insulating film formation, an elongated first insulating film is formed on the first surface of each resistor element bar with the first insulating film leaving uncovered two marginal regions of the first surface spaced from each other in a width direction of the first surface, and an elongated second insulating film is formed on the second surface of each resistor element bar with the second insulating film leaving uncovered two marginal regions of the second surface spaced from each other in a width direction of the second surface,
- wherein in the conductor layer formation, a conductor layer is formed by plating on exposed portions of each resistor element bar that are not covered by the first and the second insulating films,
- wherein in the longitudinal division, each resistor element bar is divided by cutting at intervals in a longitudinal direction of said each resistor element bar.

9. The chip resistor according to claim 1, wherein each of the first electrode and the second electrode comprises a Cu layer formed directly on the resistor element and a Sn-containing layer formed on the Cu layer, the Sn-containing layer having inner edges that are spaced from the first surface and the second surface, respectively, of the resistor element by the intervention of the first insulating layer and the second insulating layer, respectively.

* * * * *